United States Patent [19]
Lee et al.

[11] Patent Number: 6,100,116
[45] Date of Patent: Aug. 8, 2000

[54] METHOD TO FORM A PROTECTED METAL FUSE

[75] Inventors: Yu-Hua Lee, Hsinchu; James Wu, Kaohsiung; Jenn Ming Huang; Cheng-Yeh Shih, both of Hsin-Chu; Min-Hsiung Chiang, Pan-Chiao, all of Taiwan

[73] Assignee: Taiwan Semiconductor Manufacturing Company, Hsin-Chu, Taiwan

[21] Appl. No.: 09/099,144

[22] Filed: Jun. 18, 1998

[51] Int. Cl.⁷ .................................................. H01L 21/82
[52] U.S. Cl. ........................... 438/128; 438/132; 438/601
[58] Field of Search .................................. 438/128, 132, 438/601, 795

[56] References Cited

U.S. PATENT DOCUMENTS

| | | | |
|---|---|---|---|
| 4,413,272 | 11/1983 | Mochizuki et al. | 357/65 |
| 4,628,590 | 12/1986 | Udo et al. | 29/575 |
| 4,827,325 | 5/1989 | Or-Bach et al. | 357/54 |
| 5,365,104 | 11/1994 | Godinho et al. | 257/529 |
| 5,538,924 | 7/1996 | Chen | 437/246 |
| 5,578,517 | 11/1996 | Yoo et al. | 437/60 |
| 5,585,662 | 12/1996 | Ogawa | 257/529 |
| 5,879,966 | 3/1999 | Lee et al. | 438/132 |
| 5,970,346 | 10/1999 | Liaw | 438/132 |
| 5,972,756 | 10/1999 | Kono et al. | 438/132 |

*Primary Examiner*—Tuan H. Nguyen
*Attorney, Agent, or Firm*—George O. Saile; Stephen B. Ackerman; William J. Stoffel

[57] ABSTRACT

A method for forming protection layers completely around a metal fuse to protect the metal fuse 74A and metal lines 74B from moisture corrosion from fuse opening and microcracks in dielectric layers. The invention surrounds the fuse on all sides with two protection layers: a bottom protection layer 70 and a top protection layer 78. The top protection layer 78 is formed over the fuse metal, the sidewalls of the metal fuse and the bottom protection layer 70. The protection layers 70 78 of the invention form a moisture proof seal structure around the metal fuse 74A and protect the metal fuse 74A and metal lines 74B from moisture and contaminates.

9 Claims, 3 Drawing Sheets

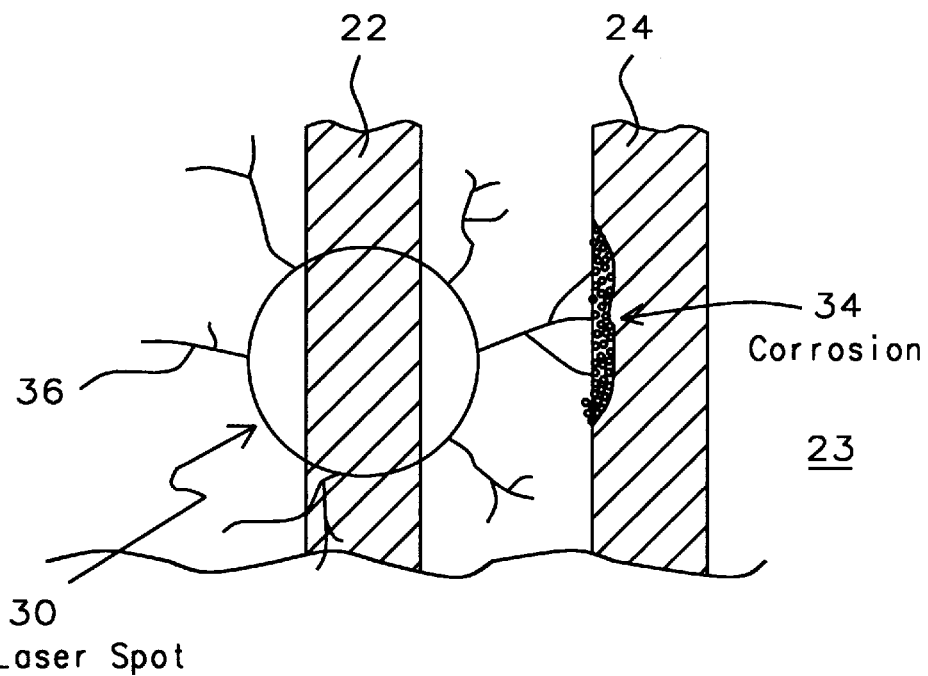
FIG. 1 - Prior Art
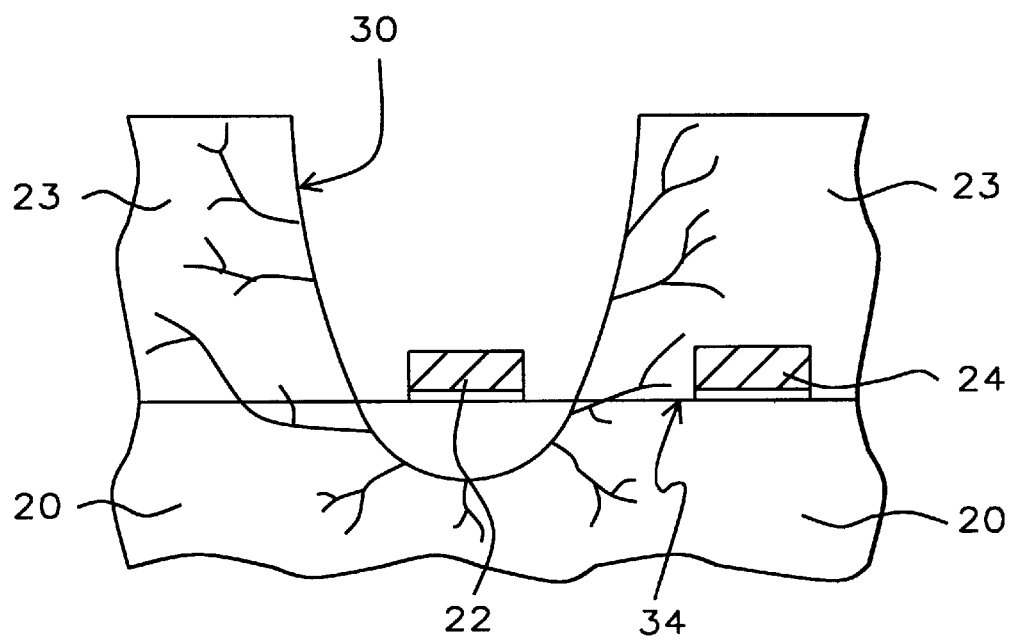
FIG. 2 - Prior Art

METHOD TO FORM A PROTECTED METAL FUSE

BACKGROUND OF INVENTION

1) Field of the Invention

This invention relates generally to the fabrication of metal fuses for semiconductor devices and more particularly to the fabrication of protective moisture proof layers over a metal fuse in a semiconductor device.

2) Description of the Prior Art

Increasing metal levels for complex/powerful circuit functions are required for future semiconductor device designs. But it makes the redundancy technology of poly fuse by laser repairing become very difficult due to too many oxide cover above fuse. Replacing the poly fuses with metal fuses is the simplest approach to overall overcome this barrier. Metal fuses with laser cuts would be preferred by industry but there are problems with fuse reliability. However, the inventors have identified problems where adjacent and neighboring metal fuse are encroached or corroded by the humidity through the micro-cracking path formed during laser energy exposure. Metal corrosion is a major issue for metal fuses with the same passivation scheme. The inventor has found that metal fuses are much more sensitive to corrosion than poly fuses.

The importance of overcoming the general problem of corrosion of fuses noted above is evidenced by the extensive technological development directed to the subject, as documented by the relevant patent and technical literature. The closest and apparently more relevant technical developments in the patent literature can be gleaned by considering U.S. Pat. No. 5,538,924(Chen), U.S. Pat. No. 5,585,662 (Ogawa). U.S. Pat. No. 5,365,104(Godinho, et. al.), U.S. Pat. No. 5,578,517(Yoo), U.S. Pat. No. 4,628,590(Udo), U.S. Pat. No. 4,827,325(Or-Back et al.), U.S. Pat. No. 5,585,662(Ogawa) and U.S. Pat. No. 4,413,272(Mochizuki).

SUMMARY OF THE INVENTION

It is an object of the present invention to provide a method for fabricating a metal fuse with protective layer surrounding the fuse.

It is an object of the present invention to provide a method for fabricating a metal fuse with protective layer surrounding the fuse on the top, sides and bottom.

It is an object of the present invention to provide a method for fabricating a metal fuse with bottom and top protective layers surrounding the fuse on the top, sides and bottom that prevents moisture form fuse openings and micro-cracks from corroding the fuses and metal lines.

To accomplish the above objectives, the present invention provides a method for forming protection layers completely around a metal fuse 74A. The invention surrounds the fuse 74A on all sides with two protection layers: a bottom protection layer 70 and a top protection layer 78. The top protection layer 78 is formed over the fuse metal, the sidewalls of the metal fuse and the bottom protection layer 70. See FIG. 5. The protection layers of the invention form a moisture proof seal structure around the metal fuse and protect the metal fuse from moisture and contaminates.

The invention provides a method of fabricating a metal fuse surrounded by protective layers; comprising the steps of:

a) See FIGS. 3A and 3B—forming a first dielectric layer 40 on a semiconductor structure;

b) forming a bottom protection layer 70 over the first dielectric layer 40; the bottom protection layer 70 composed of SiON, SiN, a two layer structure of $SiO_2$ and SiN, and the bottom protection layer 70 having a thickness in a range of between about 500 and 1000 Å;

c) forming a metal fuse 74A over the bottom protection layer 70;
  (1) the formation of the metal fuse 74A further includes simultaneously forming a metal wiring layer (M1, M2, M3, etc); See FIG. 4.

d) forming a top protection layer 78 on the fuse metal, the sidewalls of the metal fuse and the bottom protection layer 70; the top protection layer 78 and the bottom protection layer 70 forming a moisture-proof seal around the metal fuse 74A; the top protection layer 78 composed of SiN, or SiON, and the top protection layer 78 having a thickness in a range of between about 500 and 1000 Å;

e) FIG. 3B—forming a second dielectric layer 82 overlying the metal fuse layer, the Top protection layer and the bottom fuse protection layer; whereby the Top fuse protection layer 78 and the bottom protection layer 70 form a moisture proof seal around the metal fuse and protect the metal fuse from moisture and contaminates.

Benefits

The two embodiments of the invention provide the following benefits:

The bottom protection layer 70 is composed of SiON or SiN is formed underneath the Metal Fuse 74A (before Metal film sputter).

The top protective layer 78 is formed on top of the fuse.

Metal fuse is encapsulated by Silicon oxynitride or silicon nitride which provides good resistance to corrosion.

metal lines are encapsulated by Silicon oxynitride or silicon nitride which provides good resistance to corrosion.

Smaller volcano after laser energy exposure

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 1 is a top down view showing fuses having a corrosion problem according to the prior art.

FIG. 2 is a cross sectional view showing fuses having a corrosion problem according to the prior art.

DETAILED DESCRIPTION OF THE PREFERRED EMBODIMENTS

Figure 3A:
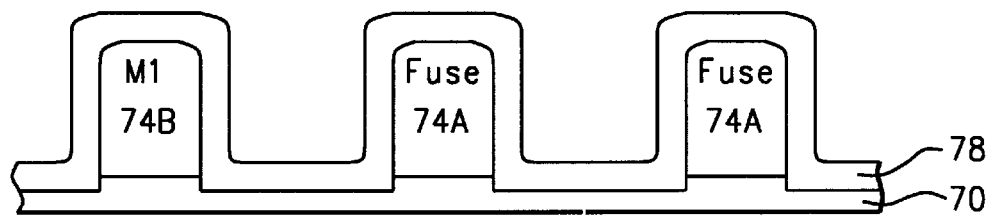
FIG. 3A is a cross sectional view of the invention for illustrating a method for manufacturing a metal fuse having protective layers surrounding the metal fuse 74A.

The present invention provides a method of forming a metal fuse with a protective structure surrounding the fuse preventing corrosion of the fuse.

Problems with Prior Fuse processes

Current processes of forming metal fuses and laser burning metal fuses cause corrosion problems which decrease yields. FIG. 1 shows a top down view of metal fuses 22 24. FIG. 2 shows a cross sectional view of a laser hole 30 formed in a dielectric layer 23 over the fuses 22 24. Laser creates the laser hole 30. The inventor has found that the laser also creates the micro-cracks in the dielectric layers that allow moisture to diffuse to the fuses 22 24 and create corrosion 34. The micro crack formation is caused by the exploding vapors from the metal vaporization from the laser. Invention—metal fuse surrounded by protective layers 70 78

Figure 3B:
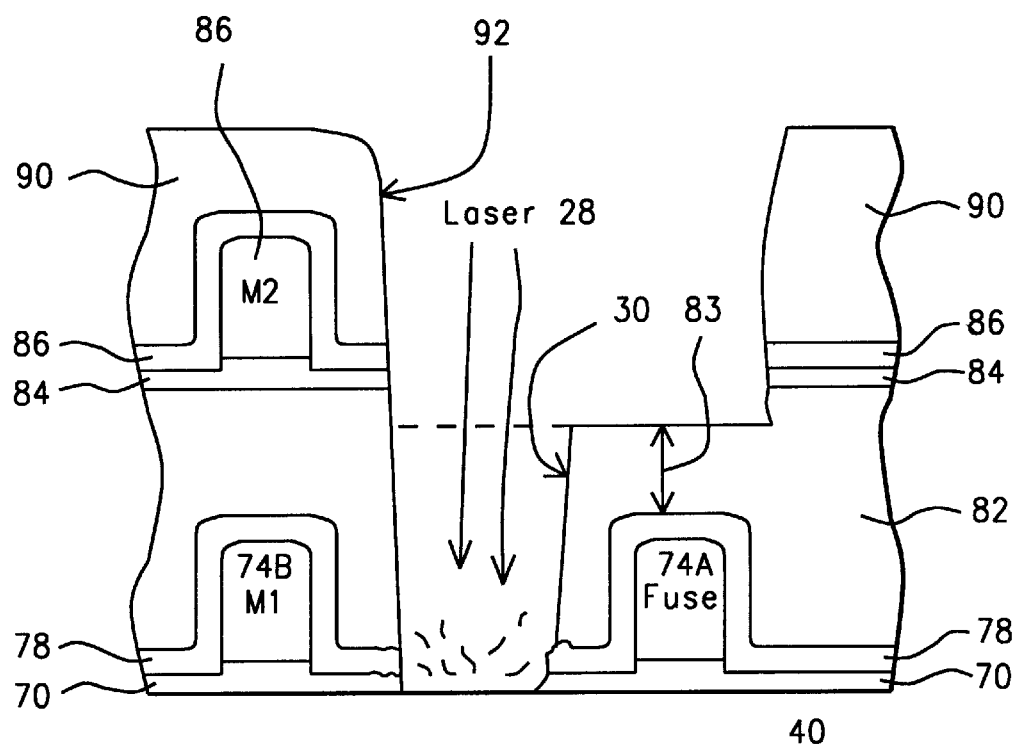
FIG. 3B is a cross sectional view of the invention for illustrating a method for manufacturing a metal fuse having protective layers surrounding the metal fuse 74A.

FIGS. 3A and 3B show the preferred embodiment for a metal fuse surrounded by protective layers 70 78.

The table below shows the major elements of the invention for FIGS. 3A and 3B.

Table of Elements

| Element number | generic name | alternate names | important features |
| --- | --- | --- | --- |
| 20 | dielectric layer | | |
| 22 | First metal fuse | | |
| 24 | second metal fuse | | |
| 30 | Laser hole | laser spot | |
| 34 | corrosion | | |
| 36 | micro cracks in dielectric layer | | |
| 40 | dielectric layer and/or semiconductor structure | | comprises a substrate, devices on substrate (e.g., FETs), conductive layers and insulating layers. |
| 70 | Bottom Protection layer | | SiON, SiN or two layer SiON and SiN thickness range 500 to 2000 Å |
| 74A | metal fuse | | |
| 74B | Metal lines | | formed form same metal layer as fuse 74A |
| 78 | Top Protection layer | | SiON, SiN or two layer structure of SiON and SiN - thickness range 500 to 1000 Å |
| 82 | second dielectric layer | inter metal dielectric layer | |
| 83 | thickness of dielectric layer over top protection layer in fuse opening | | optional |
| 84 | second bottom protection layer | | |
| 86 | second metal layer | | could be any metal level (M1, M2, M3, etc) |
| 92 | fuse opening | | |

FIG. 3A shows the step of providing a first dielectric layer 40 (e.g., interlevel dielectric layer which is the dielectric between polysilicon layers and metal layers or inter metal dielectric (IMD) layer which is the dielectric Between metal layers) over a semiconductor structure (not shown). The semiconductor structure is understood to comprise a substrate, devices on substrate (e.g., FETs), conductive layers and insulating layers.

A. a bottom protection layer 70

Next a bottom protection layer 70 is formed over the first dielectric layer 40. The bottom protection layer is 70 preferably composed of SiON, SiN, or a two layer structure of Bottom SiON and top SiN. The bottom protection layer 70 preferably has a thickness in a range of between about 500 and 2000 Å.

B. metal fuse 74A and metal layers 74B

Next, a metal fuse 74A and metal lines 76b are formed over the bottom protection layer 70. The metal fuse 74A is preferably composed of an aluminum cooper alloy but it is understood the any acceptable metal fuse material could be used. The metal fuse is formed by depositing a blanket metal layer and patterning the blanket metal layer. Metal wires/interconnects are preferably formed from the same metal layer as the fuse. See FIGS. 3A, 3B and 4. The metal layer and fuse 74A 74B can be formed at any metal level (e.g., (M1, M2, M3 . . . ).

The metal fuse 74A can comprises a barrier layer and a metal, The barrier layer is preferably formed on the bottom fuse protection layer. The barrier layer is preferably composed of TiN. The barrier layer preferably has a thickness in a range of between about 100 and 1500 Å. The metal fuse 74A has sidewalls.

The formation of the metal fuse 74A further includes simultaneously forming a metal wiring layer 74B such as a first or second metal layer (M1 or M2). See FIGS. 3A and 4. The invention's bottom and top protective layers surround the metal lines.

C. a top protection layer 78

A top protection layer 78 is now formed over the fuse metal, the sidewalls of the metal fuse, the bottom protection layer 70 and the metal lines (74B). The top protection layer 78 and the bottom protection layer 70 form a moisture-proof seal around the metal fuse 74A and the metal lines 74B.

The top protection layer 78 is preferably composed of SiN, or Silicon oxynitride. The top protection layer 78 preferably has a thickness in a range of between about 500 and 1000 Å.

As shown in FIG. 3B, a second dielectric layer 82 is formed overlying the metal fuse layer 74A, the metal layer 74B (e.g., M1, M2, M3, . . . ), the Top fuse protection 78 and the bottom fuse protection layer 70.

FIG. 3B shows an option for forming the invention's protective layers 70 84 around other metal layers (e.g., M1, M2 . . . ). In this option, another bottom protection layer 84 is formed over the second dielectric layer 82. Metal lines 86 are formed over the bottom protection layer 84. A second top protection layer 88 can be is now formed over the metal lines (86). Other overlying layers (metal and dielectric) (not shown) can be formed thereover.

A passivation layer 90 is formed over the resulting surface. A fuse opening 92 is formed over the metal fuse 74A. The fuse opening 92 can go through all or some of the dielectric layer 82. FIG. 3B shows a thickness 83 of the dielectric layer 82 remaining over the top protective layer over the fuses. A laser 28 burns through the dielectric layer, the top protective layer 78 and melts the fuse 74A to from the laser hole 30. The metal vapor from the metal and dielectric layers caused micro-cracks. But the invention's protective layer prevents the fuses and metal line from corroding. The metal fuse layer 74A, the Top fuse protection layer 78 and the bottom fuse protection layer 70 form a moisture proof seal around the metal fuse and protect the metal fuse from moisture and contaminates.

D. Fuse as a higher metal layer—FIG. 4

Figure 4:
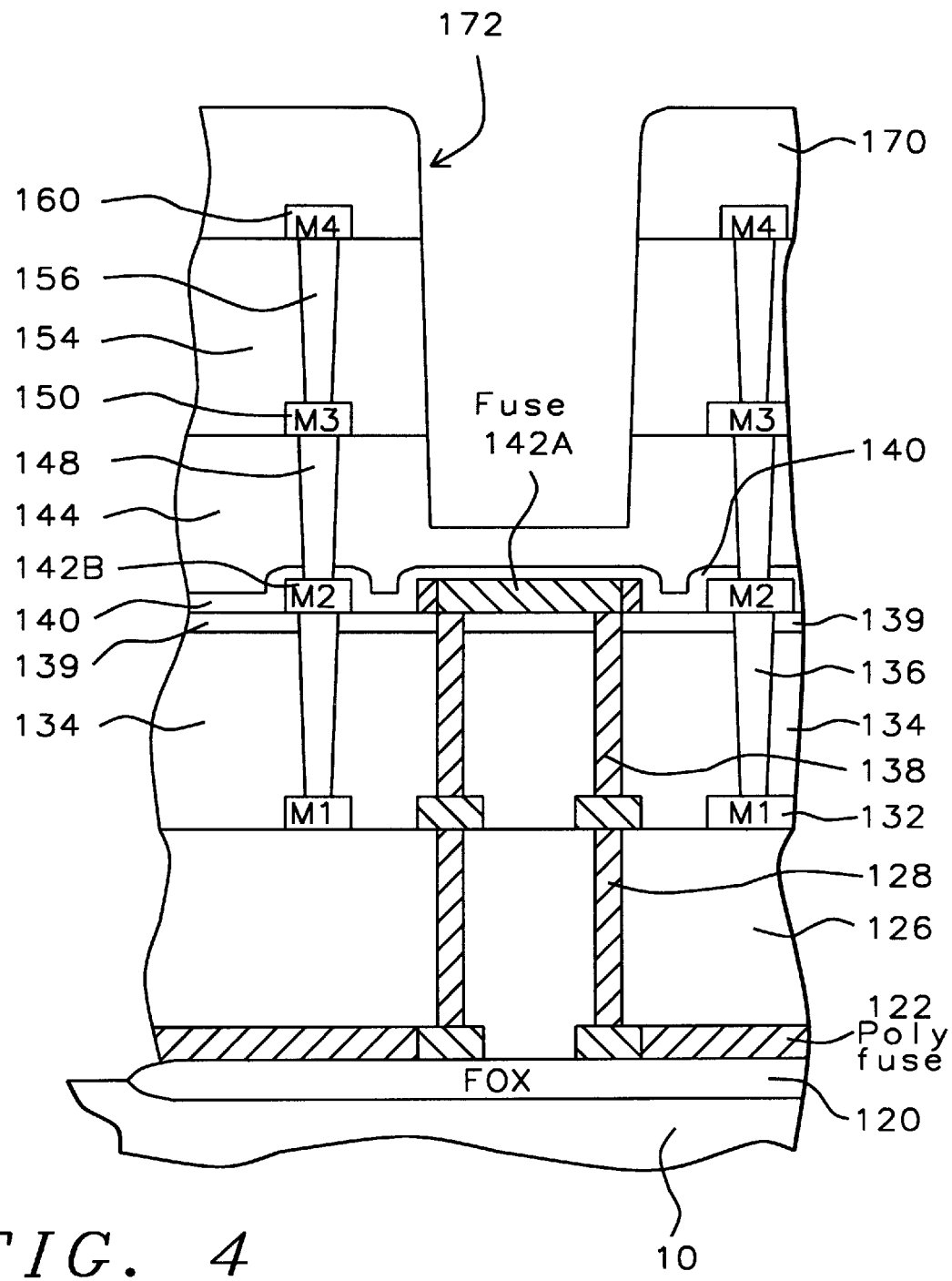
FIG. 4 is a cross sectional view of the invention for illustrating a method for manufacturing a metal fuse 142A having protective layers 139 140 surrounding the metal fuse 142A and the metal lines 142B (M2).

FIG. 4 is a cross sectional view of the invention for illustrating a method for manufacturing a metal fuse 142A having protective layers 139 140 surrounding the metal fuse 142A and the metal lines 142B (M2). FIG. 4 shows a substrate 10, field oxide 120, polysilicon layer 122, interlevel dielectric layer 126, stack connector 128, Metal layer (M1)132, inter metal dielectric (IMD) 134, stack connectors 136 138, metal 2 layer 142B, metal fuse 142, higher inter metal dielectric layers 144, 154 and metal layers 150 160 (M3 and M4), stack connectors 148 156, top passivation layer 170, fuse opening 172.

The invention's bottom protection layer 139 is formed on the dielectric layer 134. Fuse(s) 142A and metal lines 142B are formed on the bottom protection layer 139. A top protection layer 140 is formed over the fuse and metal line (M2). The protection layers prevent moisture form the fuse opening, laser hole 30 and micro-cracks (not shown) from corroding the fuses 142A and metal lines 142B. Also, optionally, the protective layers 139 140 could be formed around the any or all of the other metal layers (132, 150 160).

In the above description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not be described in detail in order to not unnecessarily obscure the present invention.

It should be recognized that many publications describe the details of common techniques used in the fabrication process of integrated circuit components. See, E.g., C. Y. Chang, S. M. Sze, in *ULSI Technology,* by The McGraw-Hill Company, Inc. copyright 1997. Those techniques can be generally employed in the fabrication of the structure of the present invention. Moreover, the individual steps of such a process can be performed using commercially available integrate circuit fabrication machines. As specifically necessary to than understanding of the present invention, exemplary technical data are set forth based upon current technology. Future developments in the art may call for appropriate adjustments as would be obvious to one skilled in the art.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a metal fuse surrounded by protective layers; comprising the steps of
   a) forming a first dielectric layer on a semiconductor structure;
   b) forming only a bottom protection layer on said first dielectric layer; said bottom protection layer is comprised of a material selected from the group consisting of SiON and SiN;
   c) forming only a blanket metal layer on said bottom protection layer; and patterning said blanket metal layer to form a metal fuse and metal lines on said bottom protection layer;
   d) forming only a top protection layer on said metal fuse, said sidewalls of said metal fuse, said metal lines, and said bottom protection layer; said top protection layer and said bottom protection layer forming a moisture-proof seal around said metal fuse; said top protection layer is composed of a material selected from the group consisting of SiN and SiON;
   e) forming only a second dielectric layer on said top protection layer protection layer; whereby, said top protection layer and said bottom protection layer form a moisture proof seal around said metal fuse and protect said metal fuse from moisture and contaminates.

2. The method of claim 1 wherein said bottom protection layer has a thickness in a range of between about 500 and 2000 Å.

3. The method of claim 1 wherein said metal fuse composed of an aluminum cooper alloy.

4. The method of claim 1 wherein said metal lines are second level (M2) metal lines.

5. The method of claim 1 wherein said top protection layer has a thickness in a range of between about 500 and 1000 Å.

6. A method of fabricating a metal fuse surrounded by protective layers; comprising the steps of:
   a) forming a first dielectric layer on a semiconductor structure; said first dielectric layer is a interlevel dielectric or an inter metal dielectric layer;
   b) forming only a bottom protection layer on the entire surface of said first dielectric layer;
      (1) said bottom protection layer comprised of a material selected from the group consisting of SiON and SiN, and said bottom protection layer having a thickness in a range of between about 500 and 2000 Å;
   c) forming only a blanket metal layer over said bottom protection layer; and patterning said blanket metal layer to form a metal fuse and metal lines over said bottom protection layer;
      (1) said metal fuse is composed of an aluminum cooper alloy;
   d) forming a top protection layer on said fuse metal, said metal lines, said sidewalls of said metal fuse and said bottom protection layer; said a top protection layer and said bottom protection layer forming a moisture-proof seal around said metal fuse;
      (1) said top protection layer is composed of a material selected from the group consisting of SiN and SiON; and said top protection layer having a thickness in a range of between about 500 and 1000 Å;
   e) forming only a second dielectric layer on said metal fuse layer, said top protection layer and said bottom fuse protection layer; whereby, said top protection layer and said bottom protection layer form a moisture proof seal around said metal fuse and protect said metal fuse from moisture and contaminates.

7. A method of fabricating a metal fuse surrounded by protective layers; comprising the steps of:
   a) forming a first dielectric layer on a semiconductor structure; said first dielectric layer is a interlevel dielectric or an inter metal dielectric layer;
   b) forming only a bottom protection layer on the entire surface said first dielectric layer;
      (1) said bottom protection layer comprised of a material selected from the group consisting of SiON and SiN, and said bottom protection layer having a thickness in a range of between about 500 and 2000 Å;
   c) forming only a blanket metal layer on said bottom protection layer; and patterning said blanket metal layer to form a metal fuse and metal lines over said bottom protection layer;
      (1) said metal fuse and metal lines composed of an aluminum cooper alloy;

d) forming only a top protection layer on said fuse metal, said metal lines, said sidewalls of said metal fuse and said bottom protection layer; said a top protection layer and said bottom protection layer forming a moisture-proof seal around said metal fuse;
  (1) said top protection layer is composed of a material selected from the group consisting of SiN and SiON; and said top protection layer having a thickness in a range of between about 500 and 1000 Å;
e) forming only a second dielectric layer on said metal fuse layer, said metal lines, said top protection layer and said bottom fuse protection layer; whereby, said top protection layer and said bottom protection layer form a moisture proof seal around said metal fuse and protect said metal fuse from moisture and contaminates.

8. The method of claim 7 which further includes after step e) forming a passivation layer over said second dielectric layer forming a fuse opening over said metal fuse through at least said passivation layer and at least portions of said second dielectric layer.

9. The method of claim 7 which further includes after step e) forming a passivation layer over said second dielectric layer forming a fuse opening over said metal fuse through all of said passivation layer and said second dielectric layer to expose said top protection layer.

* * * * *